US009903761B2

(12) United States Patent
Kim et al.

(10) Patent No.: US 9,903,761 B2
(45) Date of Patent: Feb. 27, 2018

(54) PHOTORECEPTOR PROTEIN-BASED SPECTROPHOTOMETER, METHOD FOR MANUFACTURING THE SAME AND METHOD FOR LIGHT DETECTION USING THE SAME

(71) Applicant: Korea Institute of Science and Technology, Seoul (KR)

(72) Inventors: Jae Hun Kim, Seoul (KR); Hyun Seok Song, Goyang-si (KR); Seok Lee, Seoul (KR); Sun Ho Kim, Seoul (KR); Taikjin Lee, Seoul (KR); Ju Yeong Oh, Gimpo-si (KR); Jun Hyong Cho, Seoul (KR); Chulki Kim, Samcheok-si (KR); Deok Ha Woo, Seoul (KR)

(73) Assignee: Korea Institute of Science and Technology, Seoul (KR)

( * ) Notice: Subject to any disclaimer, the term of this patent is extended or adjusted under 35 U.S.C. 154(b) by 0 days.

(21) Appl. No.: 14/281,348

(22) Filed: May 19, 2014

(65) Prior Publication Data

US 2014/0340678 A1    Nov. 20, 2014

(30) Foreign Application Priority Data

May 20, 2013    (KR) .......................... 10-2013-0056408

(51) Int. Cl.
*G01J 3/50*    (2006.01)
*G01J 1/42*    (2006.01)
(Continued)

(52) U.S. Cl.
CPC . *G01J 3/50* (2013.01); *G01J 1/42* (2013.01); *G01J 3/2803* (2013.01);
(Continued)

(58) Field of Classification Search
CPC ... G01J 1/42; G01J 3/50; G01J 3/2803; H01L 51/428; H01L 51/0093
See application file for complete search history.

(56) References Cited

U.S. PATENT DOCUMENTS 4,804,834 A  *  2/1989  Katsura ................. B82Y 10/00
                                                250/214.1
4,896,049 A  *  1/1990  Ogawa .......................... 250/226
(Continued)

FOREIGN PATENT DOCUMENTS

KR    10-2002-0011385 A    2/2002
WO    WO 2000/063680 A1    10/2000
WO    WO 2004/013915 A1    2/2004

OTHER PUBLICATIONS

Terakita, A. "The Opsins." Genome Biology 6.3 (2005): 213. PMC.*

(Continued)

*Primary Examiner* — Dominic J Bologna
(74) *Attorney, Agent, or Firm* — NSIP Law

(57) ABSTRACT

A photoreceptor protein-based spectrophotometer may include a field-effect transistor and a photoreceptor protein on the field-effect transistor (FET), the photoreceptor protein exhibiting change in electrical properties by absorbing light and being activated. Since the spectrophotometer can convert the light absorbed by the photoreceptor protein to an electrical signal using the FET, it can mimic human vision by using human photoreceptor proteins. The spectrophotometer can measure the color, intensity, etc. of light of broad wavelength ranges as in human vision. Thus, the spectrophotometer can be applied to the development of artificial vision, etc.

13 Claims, 2 Drawing Sheets

(51) Int. Cl.
G01J 3/28 (2006.01)
H01L 51/00 (2006.01)
H01L 51/42 (2006.01)

(52) U.S. Cl.
CPC ........ *H01L 51/0093* (2013.01); *H01L 51/428* (2013.01); *Y10T 29/49002* (2015.01)

(56) References Cited

U.S. PATENT DOCUMENTS

| | | | | |
|---|---|---|---|---|
| 4,965,174 | A | * | 10/1990 | Arai ........................ B82Y 10/00 430/292 |
| 5,438,192 | A | * | 8/1995 | Kaplan et al. ............. 250/214.1 |
| 7,638,073 | B2 | * | 12/2009 | Jensen et al. ................. 252/500 |
| 2005/0093425 | A1 | * | 5/2005 | Sugiyama ...................... 313/495 |
| 2009/0032683 | A1 | * | 2/2009 | Knopf .................... B82Y 10/00 250/208.1 |
| 2010/0160482 | A1 | * | 6/2010 | Nachbaur ............. C08F 220/26 523/106 |
| 2014/0176950 | A1 | * | 6/2014 | Narayan et al. ............. 356/407 |

OTHER PUBLICATIONS

Yoshizawa, T. et at., (1991), Iodopsin, a Red-Sensitive Cone Visual Pigment in the Chicken Retina. Photochemistry and Photobiology, 54: 1061-1070.*

Kim, Tae Hyun, et al. "Single-Carbon-Atomic-Resolution Detection of Odorant Molecules using a Human Olfactory Receptor-based Bioelectronic Nose." *Advanced Materials* 21.1 (2009): 91-94.

Yoon, Hyeonseok, et al. "Polypyrrole Nanotubes Conjugated with Human Olfactory Receptors: High-Performance Transducers for FET-Type Bioelectronic Noses." *Angewandte Chemie International Edition* 48.15 (2009): 2755-2758.

Song, Hyun Seok, et al. "Expression, solubilization and purification of a human olfactory receptor from *Escherichia coli*." *Current microbiology* 59.3 (2009): 309-314.

Kim, Tae Hyun, et al. ""Bioelectronic super-taster" device based on taste receptor-carbon nanotube hybrid structures." *Lab on a Chip* 11.13 (2011): 2262-2267.

Song, Hyun Seok, et al. "Human taste receptor-functionalized field effect transistor as a human-like nanobioelectronic tongue." *Nano letters* 13.1 (2013): 172-178.

* cited by examiner

PHOTORECEPTOR PROTEIN-BASED SPECTROPHOTOMETER, METHOD FOR MANUFACTURING THE SAME AND METHOD FOR LIGHT DETECTION USING THE SAME

CROSS-REFERENCE TO RELATED APPLICATION

This application claims priority to Korean Patent Application No. 10-2013-0056408, filed on May 20, 2013, and all the benefits accruing therefrom under 35 U.S.C. § 119, the contents of which in its entirety are herein incorporated by reference.

BACKGROUND

1. Field

Embodiments relate to a spectrophotometer capable of absorbing light and converting the absorbed light into an electrical signal by mimicking actual human eyes using photoreceptor proteins.

2. Description of the Related Art

Photoreceptor proteins are proteins present on the cell membrane of optic nerve cells and absorb light. The photoreceptor protein consists of retinal which is an oxidation product of vitamin A coupled with the membrane protein of opsin. Opsins are membrane proteins present on the cell membrane of optic nerves. Humans have four kinds of opsins, which are iodopsins present in cone cells and allow distinguishment of red, green and blue colors, and opsin present in rod cells allows distinguishment of light and darkness. Photopsin consists of iodopsin bound with retinal and rhodopsin consists of opsin bound with retinal. When the photoreceptor protein absorbs light, energy is produced while opsin and retinal are split from each other. The energy is transferred to the brain via the optic nerve, thus allowing perception of light.

A spectrophotometer is a device that can measure intensity of light as a function of wavelength. The spectrophotometer is used to measure light intensity, reflection, transmittance, absorption, etc. Typically, the spectrophotometer consists of a light source, a monochromator, a detector, etc. Light from a light source is dispersed into different wavelength components by the monochromator, and the detector measures the intensity of the dispersed wavelength components. However, with conventional spectrophotometers, it is difficult to measure the wavelength components from a broadband light source at the same time like a human eye does. Although the monochromator can be used to disperse the light into monochromatic lights so that the intensity of the wavelength components can be measured, it is not possible to measure complex light as good as the human vision.

SUMMARY

An aspect of the present disclosure is directed to providing a spectrophotometer capable of reproducing human vision and measuring the wavelength, intensity, etc. of light by coupling a photoreceptor with a field-effect transistor, an artificial retina kit comprising the same, a method for manufacturing the same and a method for detecting light using the same.

According to an embodiment, a photoreceptor protein-based spectrophotometer includes: a field-effect transistor; and a photoreceptor protein on the field-effect transistor, the photoreceptor protein exhibiting change in electrical properties by absorbing light and being activated.

According to another embodiment, an artificial retina kit includes the photoreceptor protein-based spectrophotometer.

According to another embodiment, a method for manufacturing a photoreceptor protein-based spectrophotometer includes: providing a field-effect transistor; and immobilizing a photoreceptor protein on the field-effect transistor, the photoreceptor protein exhibiting change in electrical properties by absorbing light and being activated.

According to another embodiment, a method for detecting light includes: providing a field-effect transistor and a photoreceptor protein disposed on the field-effect transistor; inducing change in electrical properties of the photoreceptor protein by applying light to the photoreceptor protein; and measuring change in electric current flowing through the field-effect transistor.

According an aspect of the present disclosure, a photoreceptor protein-based spectrophotometer in which the photoreceptor protein is coupled with a field-effect transistor can be provided. Human vision is achieved by the photoreceptor proteins present in optic nerve cells, which absorb light and allow distinguishment of various colors as well as light and darkness. The photoreceptor protein-based spectrophotometer can mimic the human vision mechanism by using human-derived photoreceptor proteins.

Since the photoreceptor protein-based spectrophotometer can measure the color, intensity, etc. of light of broad wavelength ranges as in human vision, it can overcome the disadvantage of conventional spectrophotometers which cannot measure a broadband light source at the same time. Also, since the photoreceptor protein-based spectrophotometer can reproduce human vision, it can be applied to the development of, for example, artificial vision.

BRIEF DESCRIPTION OF THE DRAWINGS

The above and other aspects, features and advantages of the disclosed exemplary embodiments will be more apparent from the following detailed description taken in conjunction with the accompanying drawings in which.

DETAILED DESCRIPTION

Figure 1:
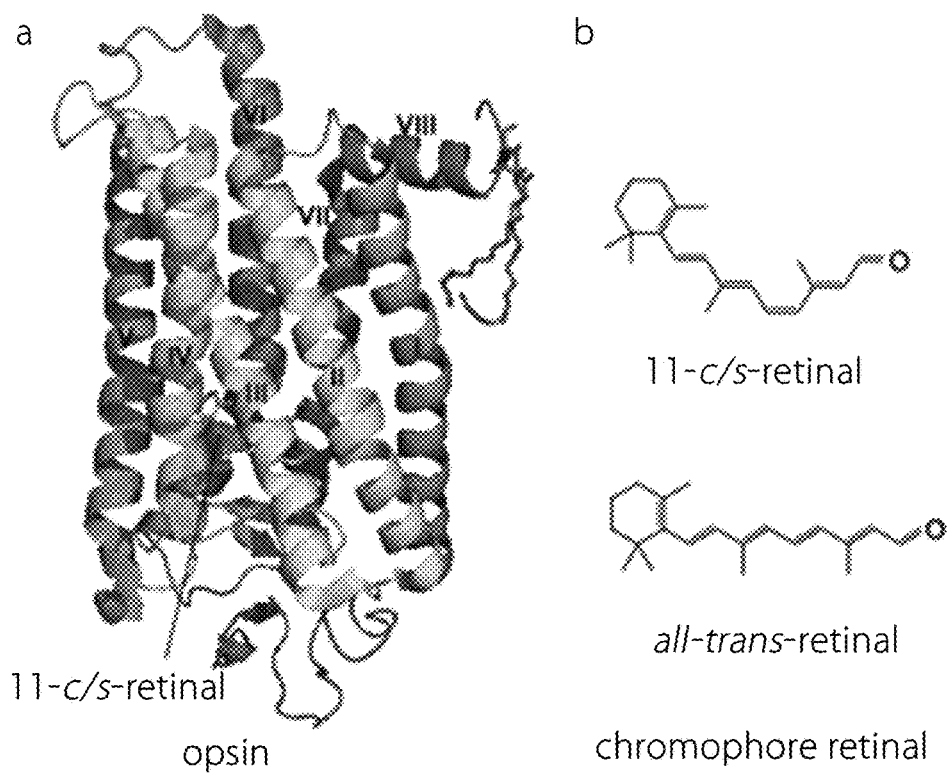
FIG. 1 schematically shows opsin and retinal constituting a photoreceptor protein used in embodiments.

Exemplary embodiments now will be described more fully hereinafter with reference to the accompanying drawings, in which exemplary embodiments are shown. The present disclosure may, however, be embodied in many different forms and should not be construed as limited to the exemplary embodiments set forth therein. Rather, these exemplary embodiments are provided so that the present disclosure will be thorough and complete, and will fully convey the scope of the present disclosure to those skilled in the art. In the description, details of well-known features and techniques may be omitted to avoid unnecessarily obscuring the presented embodiments.

The terminology used herein is for the purpose of describing particular embodiments only and is not intended to be limiting of the present disclosure. As used herein, the singular forms "a", "an" and "the" are intended to include the plural forms as well, unless the context clearly indicates otherwise. Furthermore, the use of the terms a, an, etc. does not denote a limitation of quantity, but rather denotes the presence of at least one of the referenced item. The use of the terms "first", "second", and the like does not imply any particular order, but they are included to identify individual elements. Moreover, the use of the terms first, second, etc. does not denote any order or importance, but rather the terms first, second, etc. are used to distinguish one element from another. It will be further understood that the terms "comprises" and/or "comprising", or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof. Unless otherwise defined, all terms (including technical and scientific terms) used herein have the same meaning as commonly understood by one of ordinary skill in the art. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein. In the drawings, like reference numerals denote like elements. The shape, size and regions, and the like, of the drawing may be exaggerated for clarity.

Embodiments of the present disclosure relate to a photoreceptor protein-based spectrophotometer. The photoreceptor protein-based spectrophotometer may include a photoreceptor protein coupled with a field-effect transistor (FET). The spectrophotometer may operate in a manner that the photoreceptor protein absorbs light applied thereto and the FET converts the light absorbed by the photoreceptor protein into an electrical signal.

FIG. 1 schematically shows opsin and retinal constituting a photoreceptor protein used in the photoreceptor protein-based spectrophotometer according to embodiments.

The photoreceptor protein can function when the chromophore retinal is bound to opsin as shown in FIG. 1. When retinal absorbs light, it isomerizes from 11-cis-retinal to all-trans-retinal and is separated from opsin.

Opsin is a membrane protein belonging to G protein-coupled receptors (GPCRs). Because of complicated structure as shown in FIG. 1 and strong hydrophobic property of opsin, it is difficult to be expressed and produced in xenogenic cells. However, a technique of producing olfactory receptors or taste receptors belonging to the same GPCR family in *E. coli* is known, and opsin can be produced from *E. coli* using this technique. For example, a method of producing olfactory receptors or taste receptors from *E. coli* is well known from articles such as (i) Song et al., "Expression, Solubilization and Purification of a Human Olfactory Receptor from *Escherichia coli*", Curr. Microbiol. (2009) 59:309-314, (ii) Song et al., "Human Taste Receptor-Functionalized Field Effect Transistor as a Human-Like Nano-bioelectronic Tongue", Nano Lett. (2013) 13:172-178, (iii) Kim et al., "Single-Carbon-Atomic-Resolution Detection of Odorant Molecules using a Human Olfactory Receptor-based Bioelectronic Nose", Adv. Mater. (2009) 21:91-94, (iv) Yoon et al., "Polypyrrole Nanotubes Conjugated with Human Olfactory Receptors: High-Performance Transducers for FET-Type Bioelectronic Noses", Angew. Chem. Int. Ed. (2009) 48:2755-2758, and (v) Kim et al., ""Bioelectronic super-taster" device based on taste receptor-carbon nanotube hybrid structures", Lab Chip (2011) 11:2262-2267). Specifically, the opsin gene may be inserted into an *E. coli* expression vector and opsin may be overexpressed in *E. coli*. Subsequently, the opsin expressed in *E. coli* may be purified. The produced opsin may be induced to reconstitute cell membrane using a commercially available lipid membrane or to refold using a surfactant. Then, the opsin induced to reconstitute cell membrane or to refold using the surfactant will have a binding site at which retinal can selectively bind. Accordingly, retinal can be selectively bound to the opsin. Therefore, a photoreceptor protein to be used in the present disclosure can be obtained by binding retinal to the produced opsin.

Figure 2:
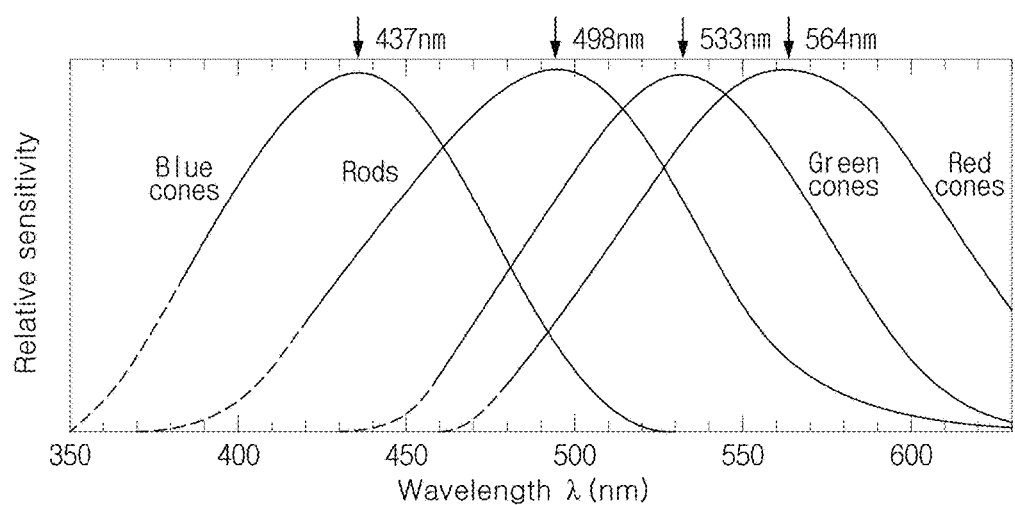
FIG. 2 shows the wavelengths of light absorbed by four kinds of human photoreceptor proteins.

FIG. 2 shows the wavelengths of light absorbed by four kinds of human photoreceptor proteins.

FIG. 2 shows the relative sensitivity (y-axis) of light absorbed by human photoreceptor proteins, which are blue cones, rods, green cones and red cones, as a function of the wavelength of the light (x-axis). Since the four photoreceptor proteins absorb light of different wavelengths, the human brain can distinguish colors and light and darkness. In an embodiment, all or part of the four human photoreceptor proteins may be used to embody a spectrophotometer that can mimic human vision.

Figure 3:
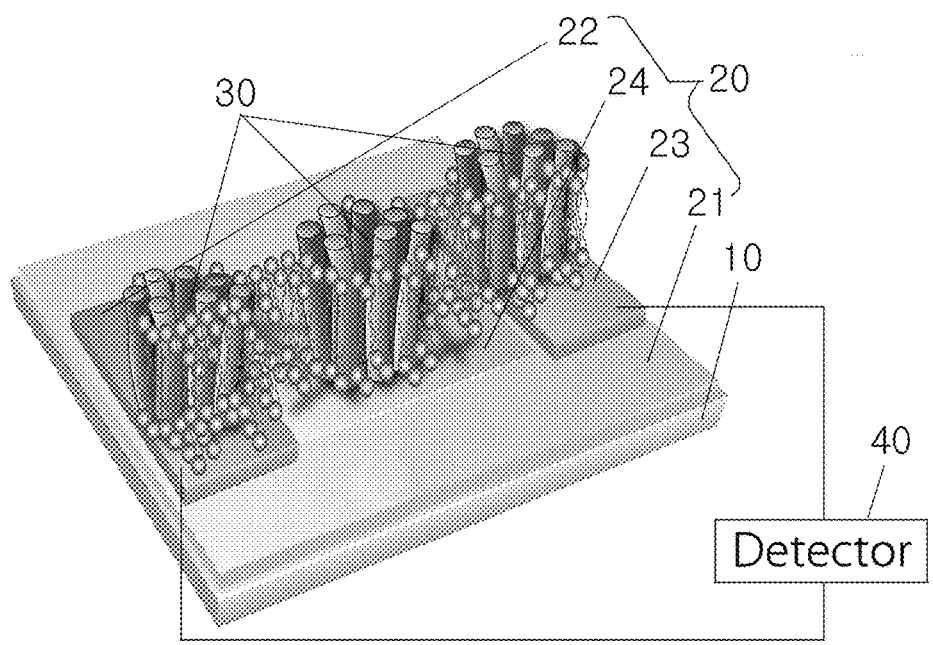
FIG. 3 schematically shows a spectrophotometer in which a photoreceptor protein is coupled with a field-effect transistor according to an embodiment.

FIG. 3 schematically shows a spectrophotometer in which a photoreceptor protein is coupled with a field-effect transistor (FET) according to an embodiment.

Referring to FIG. 3, a spectrophotometer according to the embodiment may include an FET 20 and a photoreceptor protein 30 disposed on the FET. In an embodiment, the FET 20 may be disposed on a substrate 10. The substrate 10 may be made of silicon or other suitable materials. Also, in an embodiment, the spectrophotometer may further include a detector 40 electrically connected to the FET 20.

The FET 20 may include a source electrode 22, a drain electrode 23 and a channel layer 24. The source electrode 22, the drain electrode 23 and the channel layer 24 may be disposed on an insulating layer 21. The channel layer 24 may include a region 200 located at least partially between the source electrode 22 and the drain electrode 23. The source electrode 22 and the drain electrode 23 may be made of metal or other suitable conducting materials. The channel layer 24 is a layer for forming a channel through which electric current can flow between the source electrode 22 and the drain electrode 23. The channel layer 24 may be made of a semiconductor material.

In the embodiment shown in FIG. 3, the entire channel layer 24 is located between the source electrode 22 and the drain electrode 23, and thus, the region 200 between the source electrode 22 and the drain electrode 23 corresponds to the entire channel layer 24. However, this is only exemplary and, in another embodiment, the channel layer 24 may be wider than that shown in FIG. 3 and only a part of the channel layer may correspond to the region 200 located between the source electrode 22 and the drain electrode 23.

The photoreceptor protein 30 may be disposed on the FET 20. In an embodiment, the photoreceptor protein 30 may be located at least partly on the region 200 between the source electrode 22 and the drain electrode 23 on the FET 20. The photoreceptor protein 30 may include at least one of the four kinds of photoreceptor proteins described above with reference to FIG. 2. For example, if all four photoreceptor proteins are coupled with the FET 20, the process by which light is absorb by human eyes and perceived by the brain can be mimicked using the spectrophotometer since the respective photoreceptor proteins respond to light of different wavelengths.

The detector 40 may be configured to measure the change in electric current occurring on the FET 20 when the photoreceptor protein 30 absorbs light. For example, the detector 40 may measure the change in electric current flowing between the source electrode 22 and the drain electrode 23. The change in electric current measured by the detector 40 is affected by the kind of the photoreceptor protein 30, the intensity of absorbed light, etc. As described above referring to FIG. 2, different type of photoreceptor proteins 30 absorb light of different wavelengths. Accordingly, the wavelength of absorbed light can be determined from the kind of the photoreceptor protein 30.

The detector 40 may include an electric current measuring means (not shown) electrically connected to the source electrode 22 and the drain electrode 23 for measuring the electric current between the source electrode 22 and the drain electrode 23. Also, the detector 40 may include a calculating means (not shown) for calculating the wavelength and/or intensity, etc. of light from the measured electric current. For example, the detector 40 may include a cable, an ammeter, a computing device such as a personal computer, and so forth.

Figure 4:
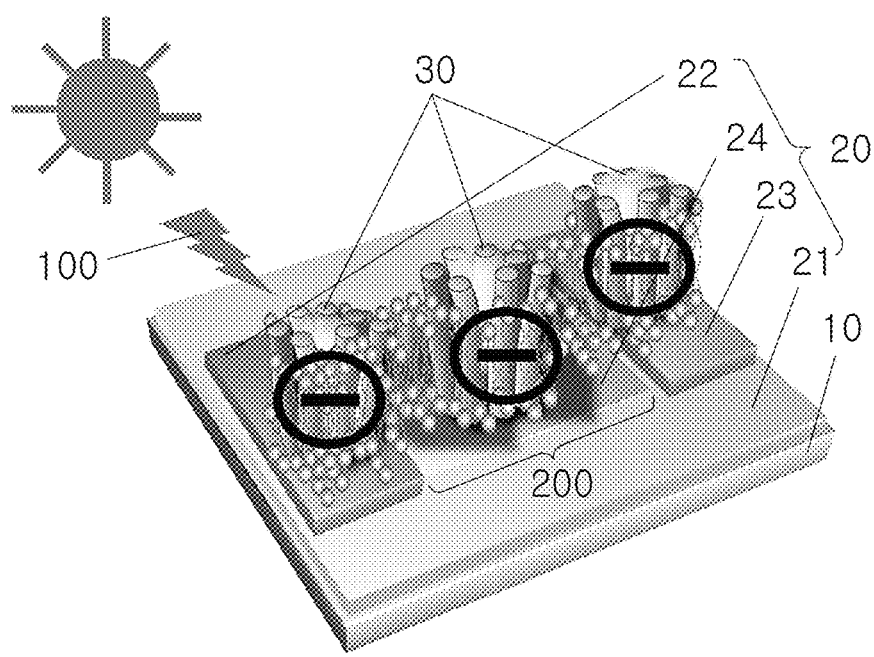
FIG. 4 schematically shows the principle on which the spectrophotometer shown in FIG. 3 operates.

FIG. 4 schematically shows the principle on which the spectrophotometer shown in FIG. 3 operates.

Referring to FIG. 4, when light 100 is applied to the photoreceptor protein 30, the FET 20 serves to convert the light absorbed by the photoreceptor protein 30 into an electrical signal. Specifically, when the photoreceptor protein 30 absorbs light 100, structural change occurs in the photoreceptor protein 30 such as separation of opsin from retinal, structural change of the photoreceptor protein, etc. This structural change causes the electric potential of the photoreceptor protein 30 to change, and as a result, the amount of electric current flowing between the source electrode 22 and the drain electrode 23 of the FET 20 changes. That is to say, in the spectrophotometer according to the embodiment, the potential change of the photoreceptor protein 30 may serve similarly to a gate voltage for the FET 20.

In order to manufacture the spectrophotometer according to the embodiments, an FET may be formed on a substrate. The FET may be formed by depositing and patterning an insulating material, a conducting material, a semiconductor material, etc. according to various known methods. The FET may be a silicon-based FET, a nanomaterial-based FET, etc. and is not particularly limited in structures or materials. A detailed description about the procedure of forming the FET will be omitted since it is well known to those of ordinary skill in the art to which the present disclosure belongs.

After the FET is prepared, a photoreceptor protein may be immobilized on the FET to manufacture a photoreceptor protein-based spectrophotometer. The photoreceptor protein may be prepared in advance, for example, through expression by *E. coli* followed by purification. The prepared photoreceptor protein may be immobilized on the FET by a chemical and/or physical method. For example, the photoreceptor protein may be immobilized on the FET such that it is located at least partially on the region between the source electrode and the drain electrode of the FET.

In order to immobilize the photoreceptor protein on the FET, the FET may be put in a phosphate buffer. Subsequently, functional groups may be formed on the surface of the FET through surface treatment. The functional group may be one that can bind with the photoreceptor protein. For example, the functional group may be one that can form a peptide bond with the photoreceptor protein. Then, the functional groups on the surface of the FET, e.g., carboxyl, amine, etc., may be bound to the photoreceptor protein by injecting several milligrams (mg) of the photoreceptor protein to the phosphate buffer.

By using the spectrophotometer according to the present disclosure, the process by which light is absorb by photoreceptor protein in human eyes and perceived by the brain can be mimicked. For example, if the four photoreceptor proteins described referring to FIG. 2 are used at the same time, human vision can be reproduced by using the same principle on which human eyes perceive light. Since the spectrophotometer can measure the wavelength and intensity of light in broad wavelength ranges at the same time, it can overcome the limitation of conventional spectrophotometers. Also, since the spectrophotometer can reproduce human vision, it can be applied to artificial vision and may be implemented as, for example, artificial retina.

According to an embodiment, the spectrophotometer according to the embodiments may be implemented as a component of an artificial retina kit. The artificial retina kit includes the photoreceptor protein which can be bound to ganglion cells in an eye of the subject. The artificial retina kit also includes the FET. The FET is packaged as a separate component from the photoreceptor protein and is used for test or inspection of the photoreceptor protein.

While the FET is electrically coupled to the photoreceptor for test or inspection, the change in electrical properties of the photoreceptor by absorbing applied light can be measured using the FET. The test or inspection using the FET can be used to determine the kind or type of the photoreceptor protein for insertion into the eye. For example, the sight of the subject may have been impaired or disabled due to damage to photoreceptor proteins the subject inherently has. Herein, the photoreceptor protein in the artificial retina kit may be determined so that it serves to supplement or replace the damaged photoreceptor proteins. After tested or inspected using the FET, the photoreceptor protein is bound to the ganglion cells which deliver electrical signal corresponding to applied light to brain. Since the photoreceptor protein exhibits change in its electrical properties according to applied light, the function of the damaged photoreceptor proteins can be restored using the photoreceptor protein of the artificial retina kit. This artificial retina kit is advantageous, among other reasons, in that no electrical element is required for use in the eye.

While the exemplary embodiments have been shown and described, it will be understood by those skilled in the art that various changes in form and details may be made thereto without departing from the spirit and scope of the present disclosure as defined by the appended claims. In addition, many modifications can be made to adapt a particular situation or material to the teachings of the present disclosure without departing from the essential scope thereof. Therefore, it is intended that the present disclosure not be limited to the particular exemplary embodiments disclosed as the best mode contemplated for carrying out the present disclosure, but that the present disclosure will include all embodiments falling within the scope of the appended claims.

What is claimed is:

1. A photoreceptor protein-based spectrophotometer, comprising:
   a field-effect transistor; and a photoreceptor protein on the field-effect transistor, the photoreceptor protein exhibiting change in electrical properties by absorbing light and being activated, wherein the photoreceptor protein comprises retinal and an animal opsin, and wherein the animal opsin comprises a G-protein coupled receptor (GPCR) protein.

2. The photoreceptor protein-based spectrophotometer according to claim 1, wherein the field-effect transistor comprises a source electrode, a drain electrode, and a channel layer comprising a region located at least partially between the source electrode and the drain electrode.

3. The photoreceptor protein-based spectrophotometer according to claim 2, wherein the photoreceptor protein is located on the region.

4. The photoreceptor protein-based spectrophotometer according to claim 1, further comprising a detector configured to detect the light absorbed by the photoreceptor protein by measuring electric current flowing through the field-effect transistor.

5. An artificial retina kit comprising the photoreceptor protein-based spectrophotometer according to claim 1.

6. The photoreceptor protein-based spectrophotometer of claim 1, wherein the animal opsin comprises a type II opsin.

7. The photoreceptor protein-based spectrophotometer of claim 1, wherein the retinal and the animal opsin, of the photoreceptor protein, separate from each other when the photoreceptor protein absorbs light.

8. The photoreceptor protein-based spectrophotometer according to claim 1, wherein the photoreceptor comprises first photoreceptors configured to detect red light, second photoreceptors configured to detect green light, third photoreceptors configured to detect blue light, and fourth photoreceptors configured to detect presence of light.

9. A method to manufacture a photoreceptor protein-based spectrophotometer, the method comprising:

providing a field-effect transistor; and immobilizing a photoreceptor protein on the field-effect transistor, the photoreceptor protein exhibiting change in electrical properties by absorbing light and being activated, wherein the photoreceptor protein comprises retinal and animal opsin, and wherein the animal opsin comprises a G-protein coupled receptor (GPCR) protein.

10. The method according to claim 9, wherein the field-effect transistor comprises a source electrode, a drain electrode, and a channel layer comprising a region located at least partially between the source electrode and the drain electrode, and the immobilizing of the photoreceptor protein comprises immobilizing the photoreceptor protein on the region.

11. A method to detect light, the method comprising:

providing a field-effect transistor and a photoreceptor protein disposed on the field-effect transistor;

inducing change in electrical properties of the photoreceptor protein by applying light to the photoreceptor protein; and measuring change in electric current flowing through the field-effect transistor, wherein the photoreceptor protein comprises retinal and an animal opsin comprising a G-protein coupled receptor (GPCR) protein.

12. The method according to claim 11, wherein the field-effect transistor comprises a source electrode, a drain electrode, and a channel layer comprising a region located at least partially between the source electrode and the drain electrode, the photoreceptor protein is located on the region, and wherein the measuring of the change in electric current comprises measuring change in electric current flowing between the source electrode and the drain electrode.

13. The method according to claim 11, further comprising detecting either one or both of wavelength and intensity of the light applied to the photoreceptor protein using the measured change in electric current.

* * * * *